(12) United States Patent
Chu et al.

(10) Patent No.: US 11,894,367 B2
(45) Date of Patent: Feb. 6, 2024

(54) INTEGRATED CIRCUIT INCLUDING DIPOLE INCORPORATION FOR THRESHOLD VOLTAGE TUNING IN TRANSISTORS

(71) Applicant: Taiwan Semiconductor Manufacturing Co., Ltd., Hsinchu (TW)

(72) Inventors: Lung-Kun Chu, Hsinchu (TW); Mao-Lin Huang, Hsinchu (TW); Chung-Wei Hsu, Hsinchu (TW); Jia-Ni Yu, Hsinchu (TW); Kuo-Cheng Chiang, Hsinchu (TW); Kuan-Lun Cheng, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 267 days.

(21) Appl. No.: 17/370,843

(22) Filed: Jul. 8, 2021

(65) Prior Publication Data
US 2023/0010502 A1 Jan. 12, 2023

(51) Int. Cl.
| | |
|---|---|
| *H01L 27/088* | (2006.01) |
| *H01L 29/423* | (2006.01) |
| *H01L 21/8234* | (2006.01) |
| *H01L 29/786* | (2006.01) |
| *H01L 29/06* | (2006.01) |

(52) U.S. Cl.
CPC .. *H01L 27/0883* (2013.01); *H01L 21/823412* (2013.01); *H01L 21/823462* (2013.01); *H01L 29/0665* (2013.01); *H01L 29/42392* (2013.01); *H01L 29/78696* (2013.01)

(58) Field of Classification Search
CPC .......... H01L 27/0883; H01L 29/42392; H01L 29/0665; H01L 29/78696; H01L 21/823412; H01L 21/823462; H01L 21/823431; H01L 29/775; H01L 21/28185; H01L 29/513
See application file for complete search history.

(56) References Cited

U.S. PATENT DOCUMENTS

2020/0373300 A1* 11/2020 Zhang ............... H01L 29/78696

* cited by examiner

*Primary Examiner* — Changhyun Yi
(74) *Attorney, Agent, or Firm* — Seed IP Law Group LLP

(57) ABSTRACT

A method for processing an integrated circuit includes forming first and second gate all around transistors. The method forms a dipole oxide in the first gate all around transistor without forming the dipole oxide in the second gate all around transistor. This is accomplished by entirely removing an interfacial dielectric layer and a dipole-inducing layer from semiconductor nanosheets of the second gate all around transistor before redepositing the interfacial dielectric layer on the semiconductor nanosheets of the second gate all around transistor.

20 Claims, 11 Drawing Sheets

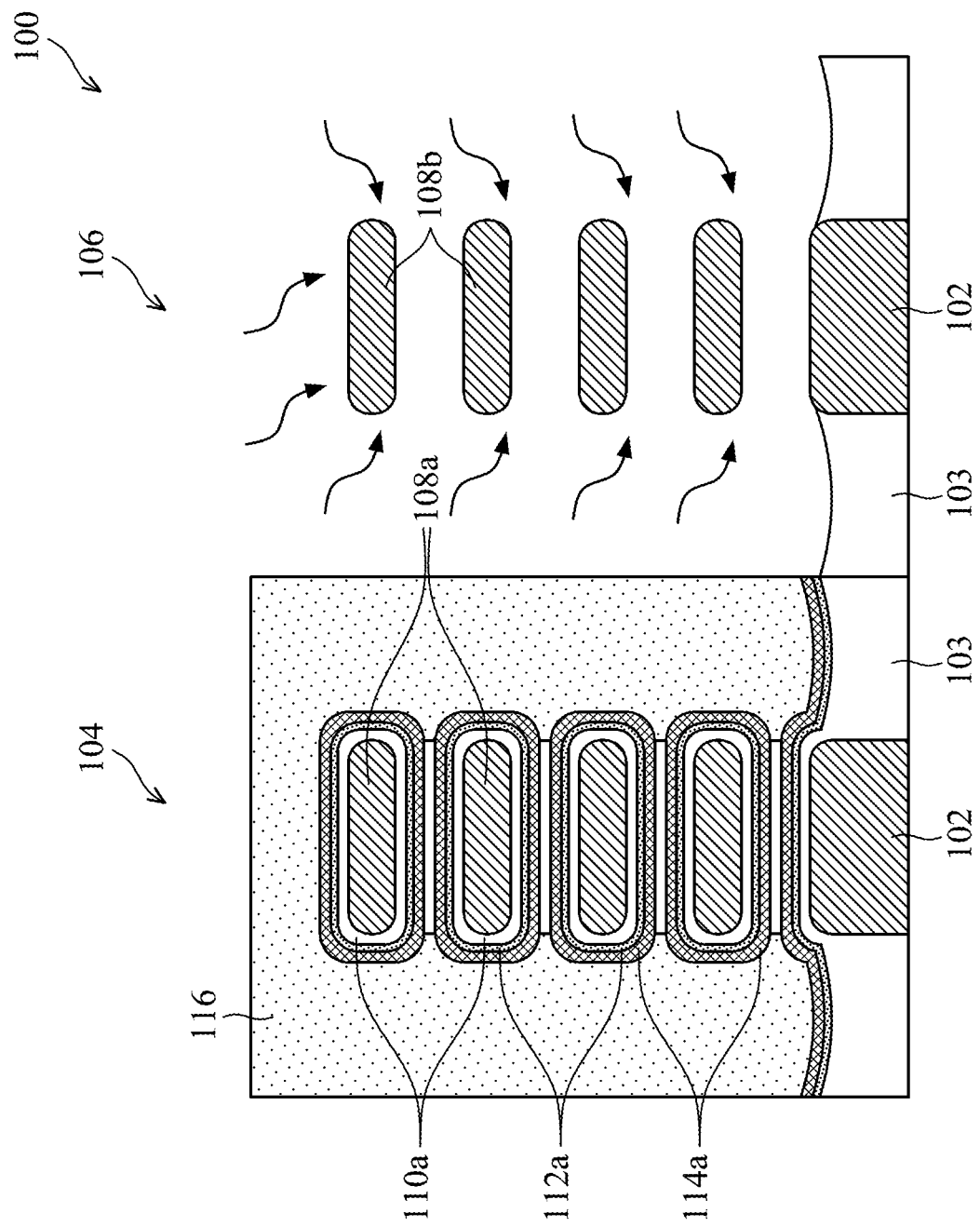

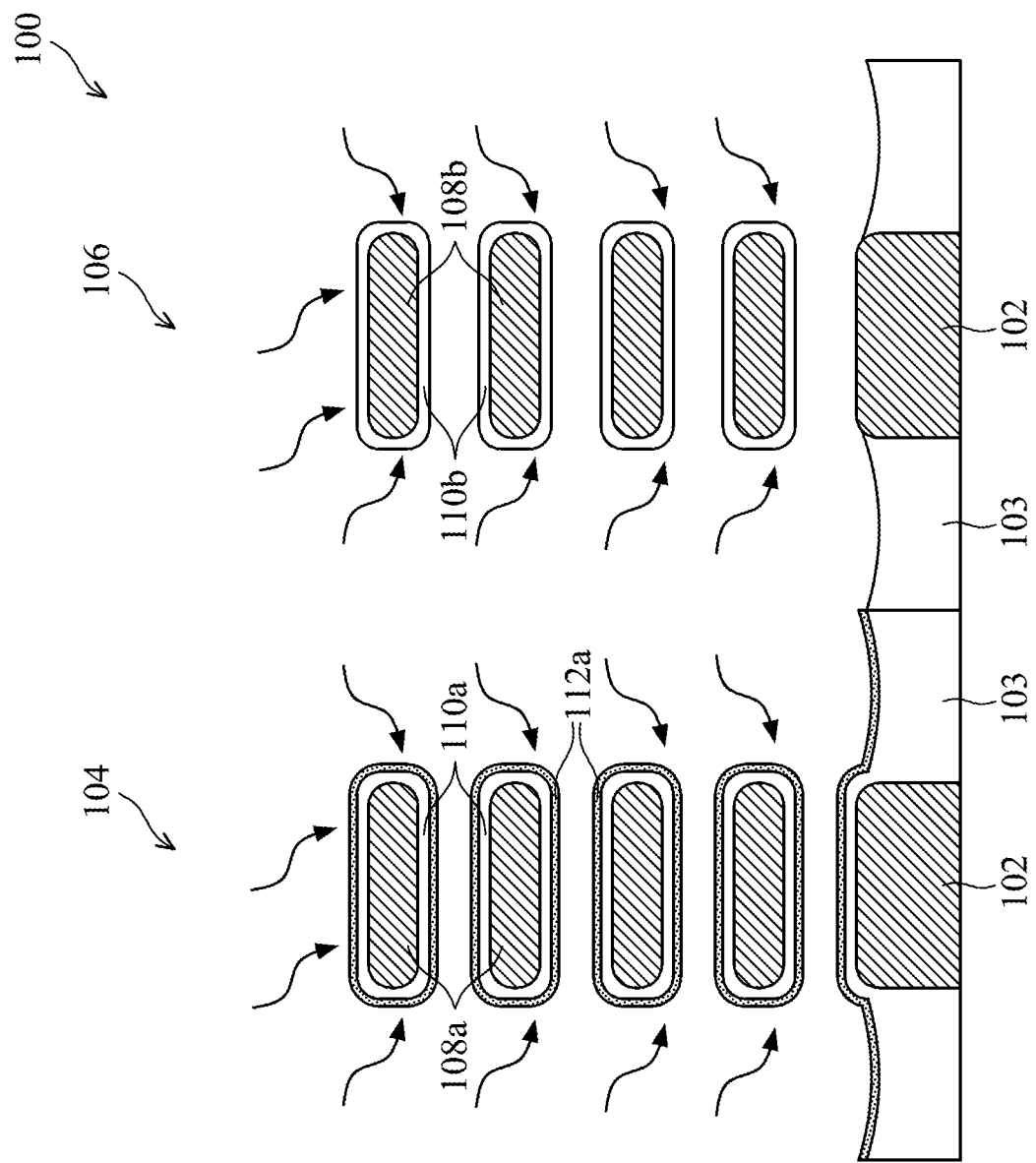

INTEGRATED CIRCUIT INCLUDING DIPOLE INCORPORATION FOR THRESHOLD VOLTAGE TUNING IN TRANSISTORS

BACKGROUND

Technical Field

The present disclosure relates to the field of semiconductor fabrication. The present disclosure relates more particularly to gate all around nanosheet transistors.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Integrated circuits may include transistors with different threshold voltages. In gate all around transistors it can be difficult to make transistors with different selected threshold voltages without also introducing unwanted variations in threshold voltages.

BRIEF DESCRIPTION OF THE SEVERAL VIEWS OF THE DRAWINGS

FIGS. 1A-1G are cross-sectional views of an integrated circuit at various stages of processing, according to one embodiment.

DETAILED DESCRIPTION

Figure 1A:
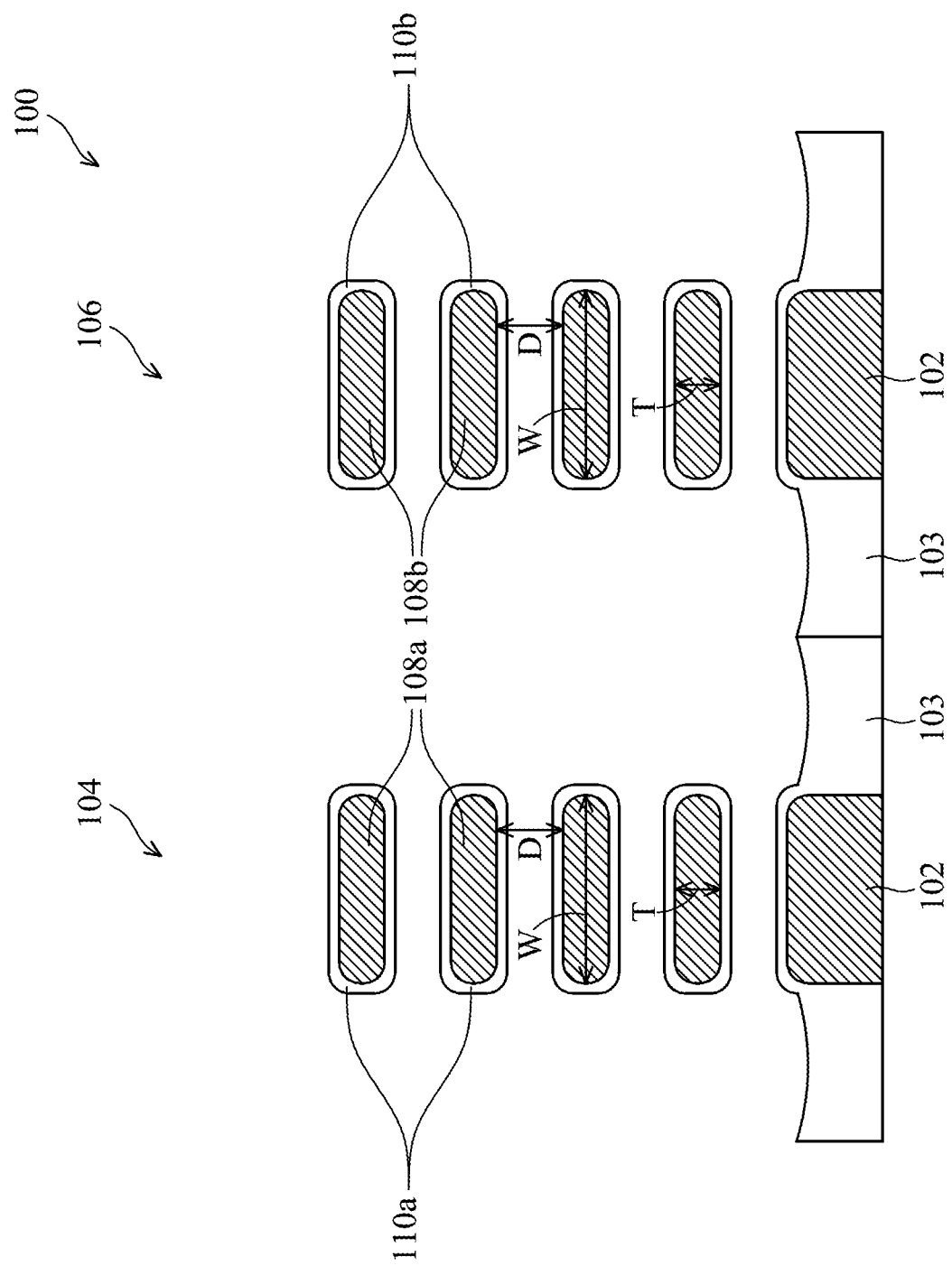

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit including gate all around transistors with different selected threshold voltages. The different selected threshold voltage are achieved by incorporating dipole layers at the interfacial dielectric layer on semiconductor nanosheets. The dipole layers are formed in a way that reduces unwanted variations in threshold voltages. This increases device performance and device yield. While the description describes incorporating dipole layers in semiconductor nanosheet transistors, the principles of dipole incorporation can extend to other types of transistor.

FIGS. 1A-G are cross-sectional views of an integrated circuit 100 at successive intermediate stages of processing, according to one embodiment. FIGS. 1A-G illustrate an exemplary process for producing an integrated circuit that includes multiple types of nanosheet transistors. FIGS. 1A-G illustrate how these types of transistors can be formed in a simple and effective process in accordance with principles of the present disclosure. Other process steps and combinations of process steps can be utilized without departing from the scope of the present disclosure.

FIG. 1A is a cross-sectional diagram of an integrated circuit 100 at an intermediate stage of processing, according to one embodiment. The view of FIG. 1A illustrates a transistor 104 and a transistor 106. The transistors 104 and 106 are formed in the same integrated circuit 100, though they may be located at different regions of the integrated circuit 100. As will be set forth in more detail below, the transistor 104 will incorporate a dipole layer while the transistor 106 will not incorporate a dipole layer. This results in the transistors 104 and 106 having different threshold voltages.

The transistors 104 and 106 are gate all around transistors. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The integrated circuit 100 includes a semiconductor substrate 102. In one embodiment, the semiconductor substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 102 includes silicon germanium (SiGe) buffer layers epitaxially grown on the silicon substrate 102. The germanium concentration of the SiGe buffer layers may increase from 30 atomic % germanium for the bottom-most buffer layer to 70 atomic % germanium for the top-most buffer layer. The substrate 102 may include various regions that have been suitably doped with impurities (e.g., p-type or n-type conductivity). The dopants are, for example boron ($BF_2$) for an n-type transistor and phosphorus for a p-type transistor.

The integrated circuit 100 may include one or more insulating features, such as shallow trench isolations 103 separating the transistors 104 from the transistors 106, or separating the transistors 104 from each other and the transistors 106 from each other. The shallow trench isolation 103 can be utilized to separate groups of transistor structures formed in conjunction with the semiconductor substrate 102. The shallow trench isolation 103 can include a dielectric material. The dielectric material for the shallow trench isolation may include silicon oxide, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation 103 without departing from the scope of the present disclosure.

The transistors 104 and 106 include many of the same types of structures and materials. Accordingly, if the transistors 104 and 106 each include a structure of a same name, the corresponding reference numbers for the transistor 104 will include the suffix "a", while the corresponding reference numbers for the transistor 106 will include the suffix "b".

The integrated circuit 100 includes a plurality of semiconductor nanosheets 108a/108b or nanowires. The semiconductor nanosheets 108a/108b are layers of semiconductor material. The semiconductor nanosheets 108a/108b correspond to the channel regions of the transistors 104 and 106, respectively. The semiconductor nanosheets 108a/108b are formed over the substrate 102. The semiconductor nanosheets 108a/108b may include one or more layers of Si, Ge, SiGe, GaAs, InSb, GaP, GaSb, InAlAs, InGaAs, GaSbP, GaAsSb or InP. In one embodiment, the semiconductor nanosheets 108a/108b are the same semiconductor material as the substrate 102. Other semiconductor materials can be utilized for the semiconductor nanosheets 108a/108b without departing from the scope of the present disclosure.

In FIG. 1A, each transistor 104 and 106 has four semiconductor nanosheets 108a/108b. However, in practice, each transistor 104 and 106 may have different numbers of semiconductor nanosheets 108a/108b than three. For example, each transistor 104 and 106 may include between 2 and 20 semiconductor nanosheets 108/108b. Other numbers of semiconductor nanosheets 108a/108b can be utilized without departing from the scope of the present disclosure.

The width W of the nanosheets 108a/108b can be between 10 nm and 40 nm. The thickness T of the nanosheets 108a/108b can be between 4 nm and 8 nm. The distance D between the nanosheets 108a/108b can be between 6 nm and 15 nm. Other thicknesses and dimensions can be utilized for the semiconductor nanosheets 108a/108b without departing from the scope of the present disclosure.

In FIG. 1A, each semiconductor nanosheet 108a/108b is covered by an interfacial dielectric layer 110a/110b. The interfacial dielectric layer 110a/110b may be used in order to create a good interface between the semiconductor nanosheets 108a/110b and subsequent dielectric layers, as will be described in further detail below. The interfacial dielectric layer 110a/110b can assist in suppressing the mobility degradation of charge carries in the semiconductor nanosheets 108a/108b that serve as channel regions of the transistors 104 and 106.

The interfacial dielectric layer 110a/110b can include a dielectric material such as silicon oxide, silicon nitride, or other suitable dielectric materials. The interfacial dielectric layer 110a/110b can include a comparatively low-K dielectric with respect to high-K dielectric such as hafnium oxide or other high-K dielectric materials that may be used in gate dielectrics of transistors. High-K dielectrics can include dielectric materials with a dielectric constant higher than the dielectric constant of silicon oxide. In the example of FIG. 1A, the interfacial dielectric layer 110a/110b is silicon dioxide, though other materials can be utilized without departing from the scope of the present disclosure.

The interfacial dielectric layer 110a/110b can be formed by a thermal oxidation process, a chemical vapor deposition (CVD) process, or an atomic layer deposition (ALD) process. The interfacial dielectric layer 110a/110b can have a thickness between 0.5 nm and 2 nm. One consideration in selecting a thickness for the interfacial dielectric layer 110a/110b is to leave sufficient space to deposit and etch various materials between the nanosheets 108a/108b, as will be explained in more detail below. Other materials, deposition processes, and thicknesses can be utilized for the interfacial dielectric layer 110a/110b without departing from the scope of the present disclosure.

Figure 1B:
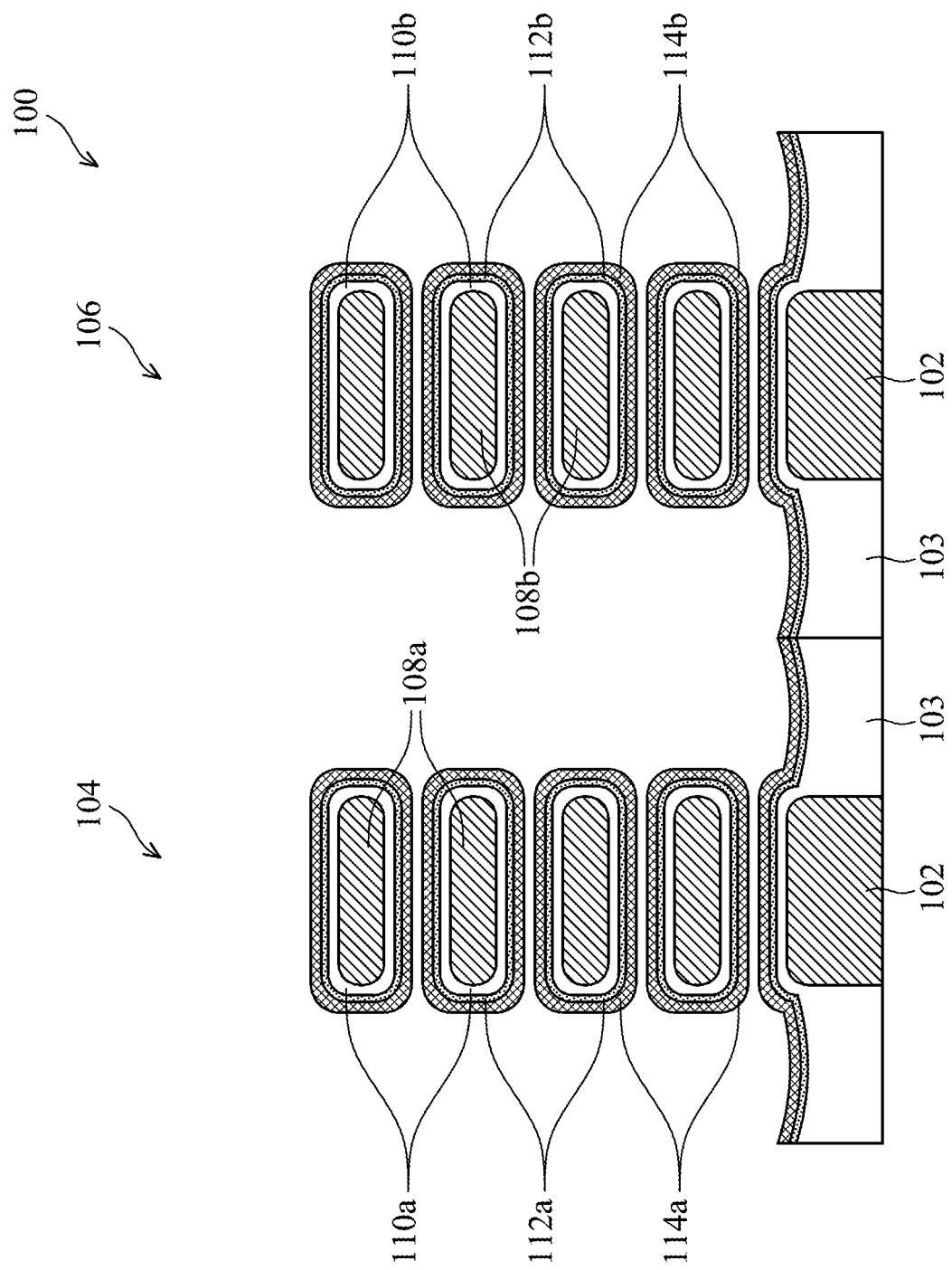

FIG. 1B is a cross-sectional view of the integrated circuit 100 at an intermediate stage of processing, according to one embodiment. In FIG. 1B, a dipole-inducing layer 112a/112b has been deposited on the interlevel of both the transistor 104 and the transistor 106. The dipole-inducing layer 112a/112b can include one or more of La, Y, Al, Sr, Er, Sc, or Nb. The dipole-inducing layer 112a/112b can have a thickness between 2 Å and 15 Å. It is beneficial for the dipole-inducing layer to be less than 15 Å so that total thickness of the gate dielectric can remain low. The dipole-inducing layer 112a/112b can be deposited by a physical vapor deposition (PVD) process, an ALD process, a CVD process, or other suitable deposition processes. The dipole-inducing layer 112a/112b can utilize other thicknesses, materials, and deposition processes without departing from the scope of the present disclosure.

One purpose of the dipole-inducing layer 112a/112b is to adjust the threshold voltage of the transistor 104 with respect to the threshold voltage of the transistor 106. The dipole-inducing layer 112a/112b will be utilized to generate a dipole layer on the interfacial dielectric layer 110a of the transistor 104. The dipole layer that will be generated from the dipole-inducing layer 112a/112b has a dipole effect that augments or reduces the effect of the voltage applied to a gate electrode in turning on or turning off the transistor 104. The dipole dopants in the dipole-inducing layer 112a/112b are driven into an adjacent dielectric layer to modulate the effective work function of the transistor, thereby increasing or decreasing the threshold voltage of the transistor 104. In the example of FIG. 1B, the materials of the dipole-inducing layer 112a/112b and the interfacial dielectric layer 110a are selected to result in a dipole layer that reduces the threshold voltage of the transistor 104. As will be set forth in more detail below, the process of producing the dipole layer from the dipole-inducing layer 112a results in substantially no dipole layer on the interfacial layer 110b of the transistor 106. Furthermore the process of producing the dipole layer from the dipole-inducing layer 112a results a different threshold voltage in the transistor 106 from that in the transistor 104.

In FIG. 1B, a hard mask layer 114a/114b has been deposited on the dipole-inducing layer 112a/112b of both the transistor 104 and the transistor 106. The hard mask layer 114 can include one or more of aluminum AlOx (where x represents the concentration of oxygen), TiOx, ZrOx, AlN, TiN, TiSiN, or other suitable materials. The hard mask layer 114 can have a thickness between 0.5 nm and 3 nm. The thickness of the hard mask layer 114 is selected to ensure that a gap remains between adjacent nanosheets 108a/108b of both the transistor 104 and the transistor 106. The hard mask layer 114 can be deposited by a PVD process, an ALD process, a CVD process, or other suitable deposition processes. The hard mask layer 114 can have other thicknesses, materials, and deposition processes without departing from the scope of the present disclosure.

FIG. 1C is a cross-sectional view of the integrated circuit 100, according to one embodiment. In FIG. 1C a layer of photoresist 116 has been deposited and patterned. The layer of photoresist 116 is patterned to expose the hard mask 114 of the transistor 106. The hard mask layer 114 of the transistor 104 is covered by the layer of photoresist 116. The layer of photoresist 116 can be deposited by standard photoresist deposition techniques including vapor deposition, spread deposition, spin-on coating, or by other suitable process. The layer of photoresist 116 can be patterned by exposing the layer of photoresist 116 to light via a photolithography mask. Accordingly, the layer of photoresist 116 can be deposited and patterned using standard photolithography techniques. The material of the hard mask 114 is chosen to enable the photoresist to stick to the hard mask 114.

In FIG. 1C, an etching process has been performed on the integrated circuit 100. In particular, an etching process is performed on the portion of the integrated circuit 100 that is not covered by the photoresist 116. The etching process etches the hard mask layer 114b and the dipole-inducing layer 112b from the transistor 106. The etching process can include an isotropic etching process that etches the hard mask layer 114b and the dipole-inducing layer 112b equally in all directions. The duration of the etching process is selected to entirely remove the hard mask layer 114b and dipole-inducing layer 112b from the nanosheets 108b of the transistor 106. The etching process can include a wet etch, a dry etch, an ALE process, a timed etch, or other suitable etching processes. The etching process can include multiple etching steps. For example, a first etching step can be performed to remove the hard mask layer 114b. A second etching step can be performed to remove the dipole-inducing layer 112b. Other types of etching processes can be utilized without departing from the scope of the present disclosure. The semiconductor nanosheets 108b of the transistor 106 are entirely exposed after the etching process.

The process shown in relation to FIGS. 1A-C provides several benefits over alternative methods for forming a dipole layer. For example, one alternative method for forming a dipole layer is to deposit the dipole-inducing layer on a high-K dielectric layer that is deposited on the interfacial dielectric layer 110a. The dipole layer has been formed by diffusing atoms from the dipole-inducing layer through the high-K dielectric layer onto the interfacial dielectric layer 110a. However, forming the hard mask on the high-K dielectric layer may result in the hard mask entirely filling the gaps between nanosheets 108b of the transistor 106. Subsequently, an etching process may fail to remove all of the hard mask from between the nanosheets 108b of the transistor 106. This is because an isotropic etching process will need to etch a thickness equivalent to the width of the semiconductor nanosheets 108b between the semiconductor nanosheets 108b of the transistor 106. Often the result is that the hard mask and the dipole-inducing layer 112b are not entirely removed between the nanosheets 108b of the transistor 106. Subsequently, a portion of the dipole layer may form at the transistor 106 where the dipole layer is intended to be entirely absent. This leads to unwanted variations in the threshold voltage of the transistor 106.

However, because the dipole-inducing layer 112a/112b and the hard mask 114a/114b are formed on the interfacial dielectric layer 110a/110b rather than on the high-K dielectric layer, the hard mask layer 114a/114b can reliably be deposited without entirely filling the gap between semiconductor nanosheets 108a/108b. Accordingly, the etching process described in relation to FIG. 1C will reliably remove all of the hard mask 114b and dipole-inducing layer 112b from the nanosheets 108b of the transistor 106. When the dipole layer of subsequently formed from the dipole-inducing layer at the transistor 104, there will be no unwanted dipole layer at the transistor 106. This ensures that the transistor 106 will not have an unwanted variation in threshold voltage, in some embodiments.

Furthermore, in the alternative process for forming a dipole layer on the transistor 104, the thermal drive-in process that causes diffusion of atoms from the dipole-inducing layer through the high-K dielectric layer can create various problems. For example, the diffusion process can create trap states in the high-K dielectric layer. These trap states can undermine the structural integrity of the high-K dielectric layer and can alter the dielectric constant of the high-K dielectric layer. Forming the dipole-inducing layer 112a/112b directly on the interfacial dielectric layer 110a/110b in accordance with principles of the present disclosure avoids damaging the high-K dielectric layer.

FIG. 1D is a cross-sectional view of the integrated circuit 100, according to one embodiment. In FIG. 1D, the photoresist 116 has been removed. The photoresist 116 can be removed by a plasma ash process. Other removal processes can be utilized to remove the photoresist 116 without departing from the scope of the present disclosure.

In FIG. 1D, the hard mask layer 114a has been removed from the transistor 104. The hard mask layer 114a can be removed via an etching process that selectively etches the hard mask layer 114a with respect to the dipole-inducing layer 112a. The etching process can include a wet etch, a dry etch, an ALE process, a timed etch, or other suitable etching processes. The result of the etching process is that the hard mask layer 114a is entirely removed from between the nanosheets 108a of the transistor 104.

In FIG. 1D, the interfacial dielectric layer 110b has been deposited or redeposited on the semiconductor nanosheets 108b of the transistor 106. In some embodiments, the interfacial dielectric layer 110b on the semiconductor nanosheets 108b of the transistor 106 can include the same materials and thicknesses as those described previously in relation to FIG. 1A. In some embodiments, the interfacial dielectric layer 110b on the semiconductor nanosheets 108b of the transistor 106 can have different materials and thicknesses than those described previously in relation to FIG. 1A.

In one embodiment, the interfacial dielectric layer 110b is formed as a result of the etching process that removes the hard mask layer 114a from the transistor 104. In at least one example in which the interfacial dielectric layer 110b is silicon dioxide, the etchant that etches the hard mask layer 114a can include oxygen. The oxygen in the etchant grows the interfacial dielectric layer 110b on the exposed surfaces of the semiconductor nanosheets 108b of the transistor 106. The oxygen in the etchant does not grow the interfacial dielectric layer 110a of the transistor 104 because the dipole-inducing layer 112a is still present on the interfacial dielectric layer 110a of the transistor 104.

In at least one example, the hard mask layer 114a includes titanium nitride. The titanium nitride can be etched by ammonium hydroxide. The ammonium hydroxide includes oxygen. The oxygen from the ammonium hydroxide etchant grows and interfacial dielectric layer of silicon dioxide on the semiconductor nanosheets 108b of the transistor 106. Accordingly, a separate step is not needed to regrow the interfacial dielectric layer 110b on the semiconductor nanosheets 108b of the transistor 106. Other materials and etchants can be utilized without departing from the scope of the present disclosure.

Figure 1E:
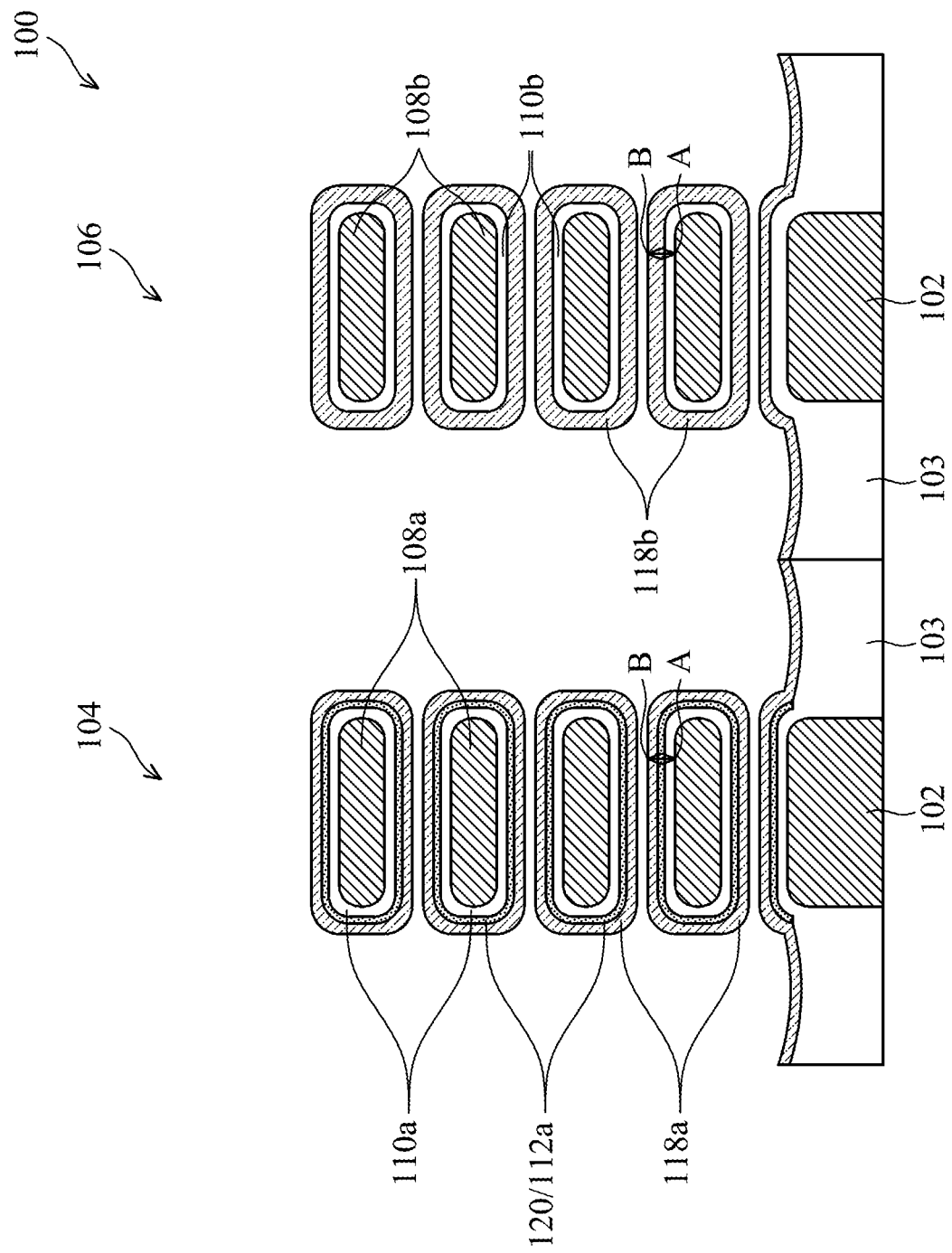

FIG. 1E is a cross-sectional view of the integrated circuit 100 at an intermediate stage of processing, according to one embodiment. In FIG. 1E, a high-K dielectric layer 118b has been deposited on the interfacial dielectric layer 110b of the transistor 106. A high-K dielectric layer 118a has been deposited on the dipole-inducing layer 112a of the transistor 104. The high-K dielectric layer 118a/118b and the interfacial dielectric layer 110a/110b collectively form a gate dielectric of the transistors 104 and 106. The high-K dielectric layer 118a/118b and the interfacial dielectric layer 110a/110b physically separate the semiconductor nanosheets 108a/108b from the gate metals that will be deposited in subsequent steps. The high-K dielectric layer 118a/118b and the interfacial dielectric layer 110a/110b isolate the gate metals from the semiconductor nanosheets 108a/108b that correspond to the channel regions of the transistors.

The high-K dielectric layer 118a/118b includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer 118a/118b may be formed by CVD, ALD, or any suitable method. In one embodiment, the high-K dielectric layer 118a/118b is formed using a highly conformal deposition process such as ALD in order to ensure the formation of a gate dielectric layer having a uniform thickness around each semiconductor nanosheet 108a/108b. In one embodiment, the thickness of the high-k dielectric is in a range from about 1 nm to about 3 nm. Other thicknesses, deposition processes, and materials can be utilized for the high-K dielectric layer 118a/118b without departing from the scope of the present disclosure.

In FIG. 1E a thermal annealing process is performed on the integrated circuit 100. The thermal annealing process can include subjecting the integrated circuit 100 to elevated temperatures for a selected duration of time. For example, the thermal annealing process can include subjecting the integrated circuit to temperatures between 100° C. and 600° C. The duration of the thermal annealing process can be between 10 seconds and 50 seconds. Other durations and temperatures can be utilized without departing from the scope of the present disclosure.

The thermal annealing process results in formation of a dipole layer 120 from the dipole-inducing layer 112a and the interfacial dielectric layer 110a. The thermal annealing process causes atoms from the dipole-inducing layer to bond with at least one of the interfacial dielectric layer 110a and the high-K dielectric layer 118a in a way that generates the dipole layer 120. The dipole layer 120 can result from polarizing at least one of the dipole-inducing layer 112a, the interfacial dielectric layer 110a, and the high-K dielectric layer 118a. The dipole layer 120 can be a dipole oxide, in the example in which the interfacial dielectric layer 110a is silicon dioxide. The dipole oxide consists of an oxide of the material of the dipole-inducing layer 112a. The dipole oxide can include oxides of Y, La, Al, Sr, Er, Sc, Nb, or other materials depending on the material of the dipole-inducing layer 112a.

The presence of the dipole layer 120 in the transistor 104 leads to the difference in threshold voltages between the transistor 104 and the transistor 106. The threshold voltage of the transistor 104 may be lower than the threshold voltage of the transistor 106 by up to 300 mV, though other threshold voltage changes are possible without departing from the scope of the present disclosure. In other embodiments, the threshold voltage of the transistor 104 may be higher than the threshold voltage of the transistor 106.

In one embodiment, the dipole layer 120 can be formed prior to deposition of the high-K dielectric layer 118a. Thermal annealing process can be performed prior to deposition of the high-K dielectric layer 118a to form a dipole layer 120 from the dipole-inducing layer 112a and the interfacial dielectric layer 110a. After deposition of the high-K dielectric layer 118a, a further thermal annealing process can be performed to generate further dipoles.

Because the high-K dielectric layer 118a/118b has been formed after the various etching processes that remove the photo resist 116, the hard mask 114a/114b, and the dipole-inducing layer 112b, the high-K dielectric layer 118a/118b is not subject to any etching steps. Because the high-K dielectric layer 118a/118b is not subject to any etching steps, the integrity of the high-K dielectric layer 118a/118b is maintained. Thus, the high-K dielectric layer 118a/118b is undamaged by the process shown in relation to FIGS. 1A-1E. Furthermore, the dipole material of the dipole layer or of the dipole-inducing layer 112a/112b is entirely absent from the interfacial dielectric layer 110b and the high-K dielectric layer 118b of the transistor 106. In other words, the concentration of the dipole material in the interfacial dielectric layer 110b and the high-K dielectric layer 118b of the transistor 106 is zero.

Figure 1F:
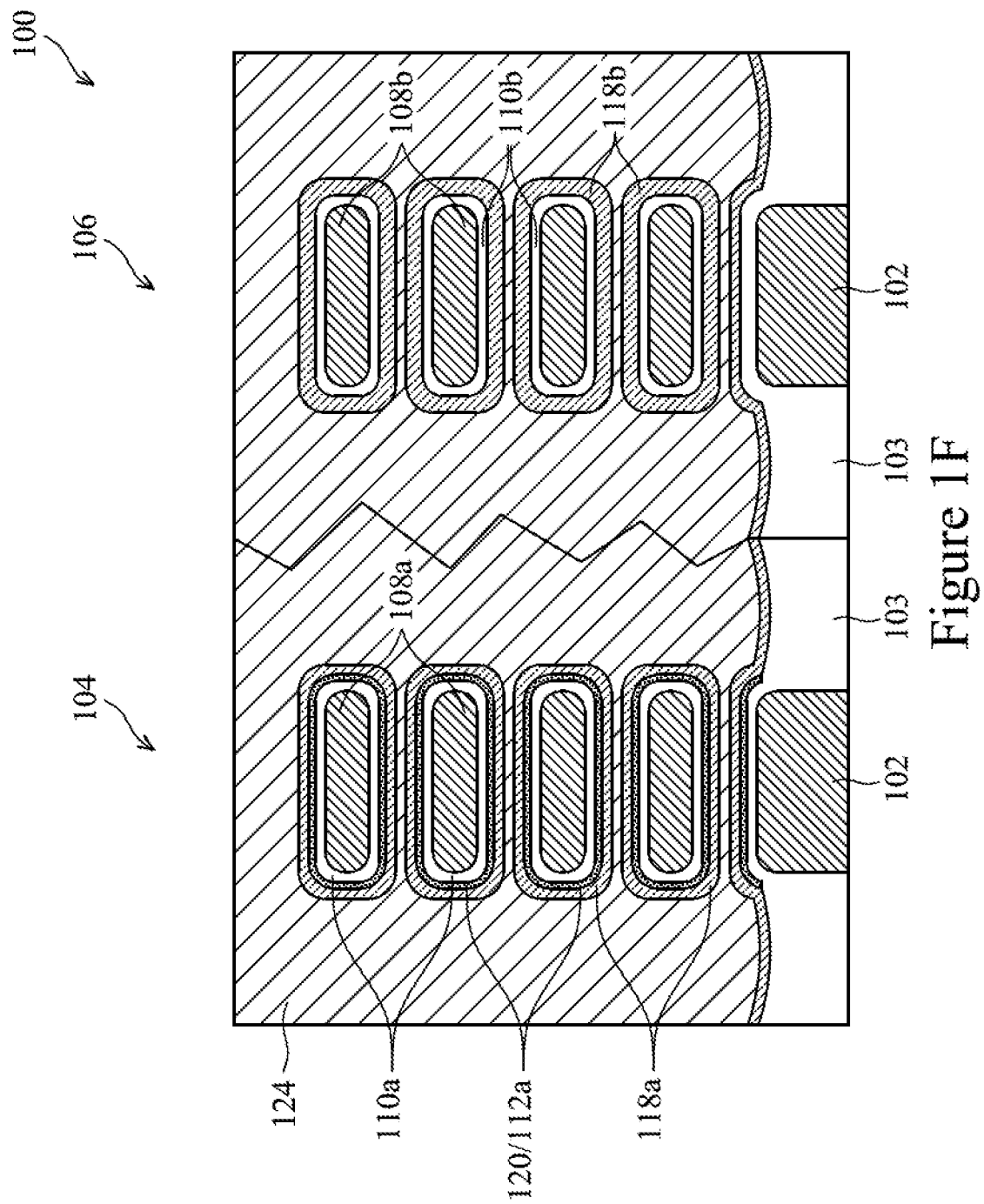

FIG. 1F is a cross-sectional view of the integrated circuit 100, according to one embodiment. In FIG. 1F, a gate metal 124 has been deposited surrounding the nanosheets 108a/108b of the transistor 104 and the transistor 106. The gate metal 124 is separated from the nanosheets 108a/108b by the interfacial dielectric layer 110a/110b, the dipole layer 120 (for the transistor 104), and the high-K dielectric layer 118a/118b.

In the view of FIG. 1F, the gate metal 124 is illustrated as a single gate metal. However, in practice, the gate metal 124 may include multiple separate metal layers. For example, the gate metal 124 may include relatively thin glue layers, barrier layers, or work function layers initially deposited on the high-K dielectric layer 118a/118b. These initial gate metal layers can include one or more of titanium nitride, tantalum nitride, tungsten nitride, tantalum, or other materials. After deposition of the initial gate metal layers, a gate fill material may be deposited. The gate fill material can include tungsten, titanium, tantalum, cobalt, aluminum, or copper. The initial gate metal layers and the gate fill material collectively make up the gate metal 124. The various layers of the gate metal 124 can be deposited with one or more deposition processes including PVD, CVD, ALD, or other suitable deposition processes. Other materials, types of layers, and deposition processes can be utilized for the gate metal 124 without departing from the scope of the present disclosure.

Figure 1G:
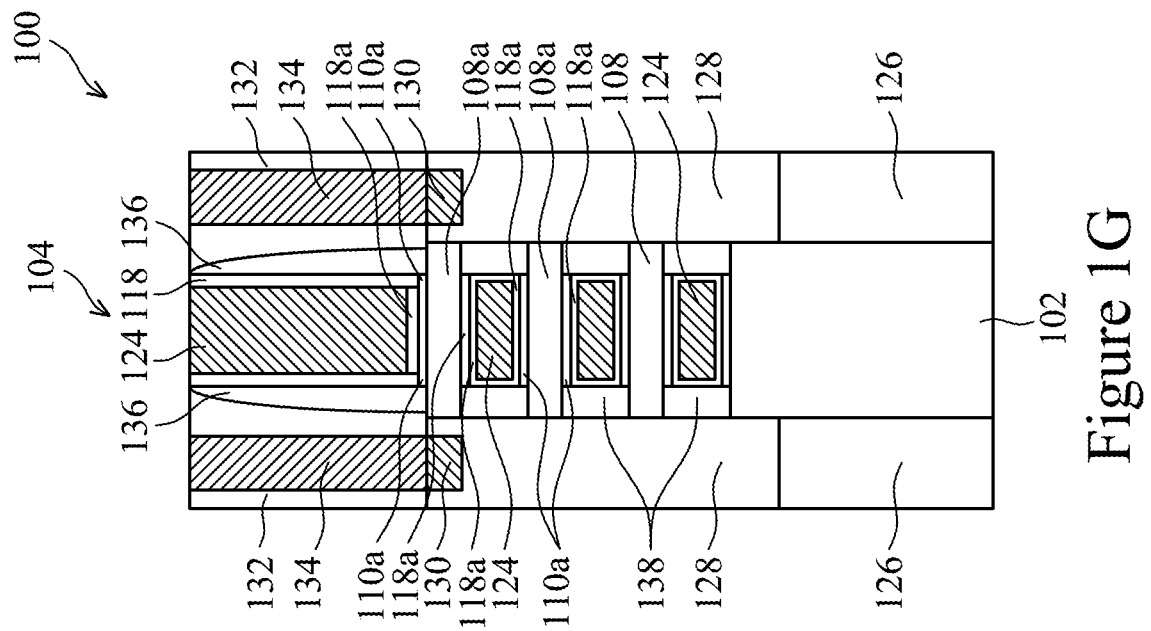

FIG. 1G is a cross-sectional view of the integrated circuit 100, according to one embodiment. The view of FIG. 1G is taken along cross-section lines G of FIG. 1F. The view of FIG. 1G illustrates more fully the overall structure of the transistor 104. The structure of the transistor 106 will be substantially similar to the structure of the transistor 104.

FIG. 1G illustrates shallow trench isolations 126 adjacent to the semiconductor substrate 102. The shallow trench isolation 126 can be utilized to separate groups of transistor structures formed in conjunction with the semiconductor substrate 102. The shallow trench isolation 126 can include a dielectric material. The dielectric material for the shallow trench isolation 126 may include silicon oxide, silicon nitride, silicon oxynitride (SiON), SiOCN, SiCN, fluorine-doped silicate glass (FSG), or a low-K dielectric material, formed by low pressure CVD (LPCVD), plasma-CVD or flowable CVD. Other materials and structures can be utilized for the shallow trench isolation 126 without departing from the scope of the present disclosure.

The integrated circuit 100 includes source and drain regions 128. The source and drain regions 128 includes semiconductor material. The source and drain regions 128 can be grown epitaxially from the semiconductor nanosheets 108a. The source and drain regions 128 can be epitaxially grown from the semiconductor nanosheets 108a or from the substrate 102 prior to formation of the nanosheets 108a. The source and drain regions 128 can be doped with N-type dopants species in the case of N-type transistors. The source and drain regions 128 can be doped with P-type dopant species in the case of P-type transistors.

The nanosheets 108a extend between the source and drain regions 128. As described previously, the nanosheets 108a correspond to the channel regions of the transistor 104. By applying selected voltages to the gate metal 124 and the source and drain regions 128, current flows through the nanosheets 108a between the source and drain regions 128.

FIG. 1G also illustrates dielectric spacers 138 positioned between the source and drain regions 128 and the gate metal 124. More particularly, the spacers 138 are positioned between the high-K dielectric layer 118a and the source and drain regions 128. The spacers 138 can include one or more dielectric materials including silicon nitride, SiON, SiOCN, SiCN, silicon oxide, or other dielectric materials. Other dielectric materials can be utilized for the spacers 138 without departing from the scope of the present disclosure.

The view of FIG. 1G illustrates the interfacial dielectric layer 110a in contact with the semiconductor nanosheets 108a. The dipole layer 120 is between the high-K dielectric layer 118a and the interfacial dielectric layer 110a. The gate metal 124 is in contact with the high-K dielectric layer 118a.

The integrated circuit 100 includes an interlayer dielectric layer 132 positioned on the source and drain regions 128. The interlayer dielectric layer 132 can include one or more of silicon oxide, silicon nitride, SiCOH, SiOC, or an organic polymer. Other types of dielectric materials can be utilized for the interlayer dielectric layer 132 without departing from the scope of the present disclosure.

The integrated circuit 100 includes silicide regions 130 that have been formed in the source and drain regions 128. The silicide regions 130 can include titanium silicide, cobalt silicide, or other types of silicide. Contact plugs 134 have been formed in the interlayer dielectric layer 132. The contact plugs 134 can include cobalt or another suitable conductive material. The contact plugs 134 can be utilized to apply voltages to the source and drain regions 128 of the transistor 104. The contact plugs 134 can be surrounded by a titanium nitride glue layer.

The gate metal 124 has been deposited in a trench formed in the interlevel dielectric layer 132. The gate metal 124 also surrounds the nanosheets 108 as shown in FIG. 1G and FIG. 1F. Sidewall spacers 136 are positioned around the gate metal 124 in the trench in the interlevel dielectric layer 132. The sidewall spacers 136 can include multiple dielectric layers including one or more of silicon nitride, silicon oxide, silicon carbide, or other suitable dielectric materials. The high-K dielectric layer 118a is also positioned on the sidewalls of the trench between the sidewall spacers 136 and the gate metal 124. Other materials, structures, and features can be included in the gate all around transistor 104, and correspondingly, the gate all around transistor 106 without departing from the scope of the present disclosure.

Figure 2A:
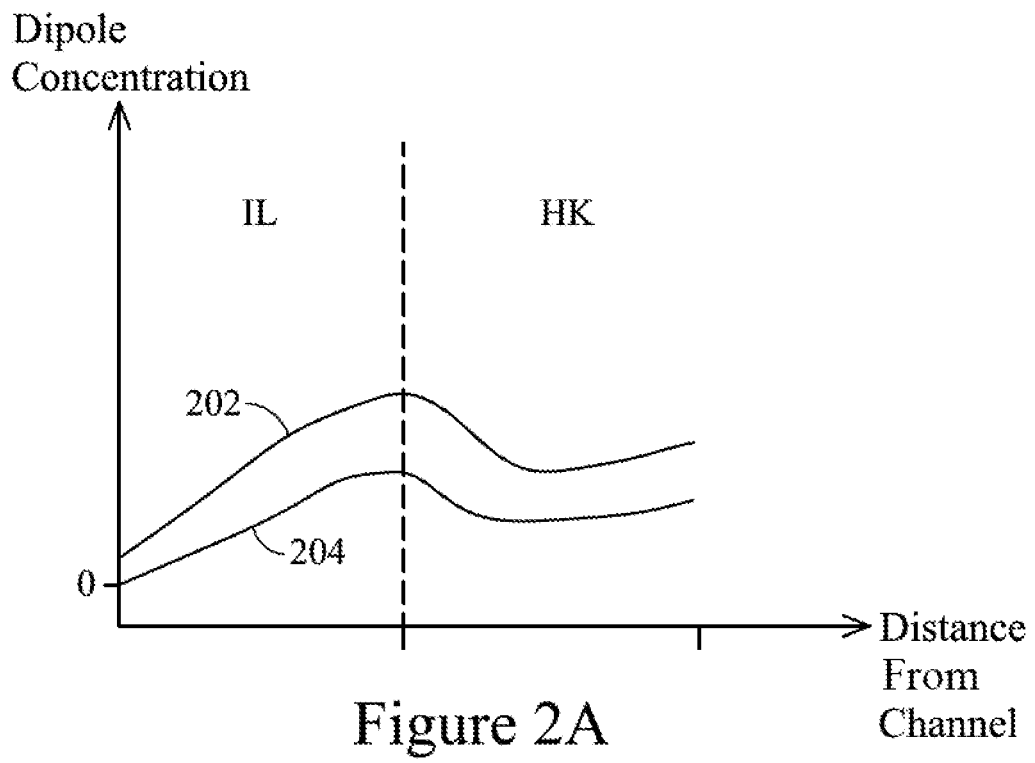
FIG. 2A is graph illustrating dipole concentration in gate dielectrics according to traditional processes.

FIG. 2A is a graph illustrating dipole concentration in a gate dielectric including an interfacial dielectric layer and the high-K dielectric layer without utilizing dipole formation methods in accordance with the present disclosure. The graph of FIG. 2A includes two curves. The curve 202 corresponds to the dipole concentration in a gate all around transistor in which dipole formation is intended at the interface between an interfacial dielectric layer (IL) and a high K dielectric layer (HK), similar to the transistor 104 but without dipole formation processes described in relation to FIGS. 1C-1E. The curve 204 corresponds to the dipole concentration in a gate all around transistor in which dipole formation is not intended in the gate dielectric, similar to the transistor 106 but without the processes described in relation to FIGS. 1C-1E.

In FIG. 2A, the curve 202 has a gradual increase in dipole concentration from the boundary of the channel region and the interfacial dielectric layer to the boundary between the interfacial dielectric layer on the high-K dielectric layer. In the high-K dielectric layer the dipole concentration decreases but does not go to zero.

In FIG. 2A, the curve 204 is similar to the curve 202 except that the dipole concentrations are lower for the curve 204 than for the curve 202. There is still significant dipole concentration in both the interfacial dielectric layer on the high-K dielectric layer for the curve 204.

The curves of FIG. 2A illustrates drawbacks of previous dipole formation processes. In the transistor for which dipole formation is intended, it is desirable for the dipole concentration to be centered at the boundary between the interfacial dielectric layer on the high-K dielectric layer. While peak dipole formation does occur at the boundary between the interfacial dielectric layer on the high-K dielectric layer, the peak is not sharp and there is an undesirable amount of dipole concentration in the interfacial dielectric layer and the high-K dielectric layer in both the curves 202 and 204.

Figure 2B:
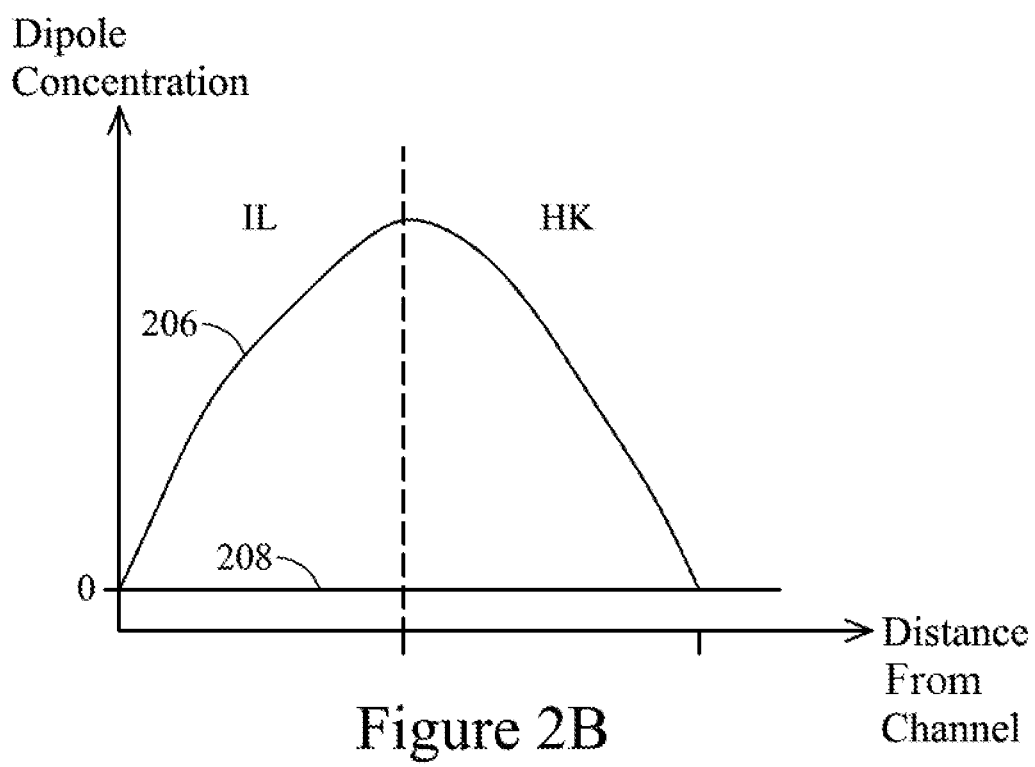
FIG. 2B is a graph illustrating dipole concentration in a gate dielectrics, according to one embodiment.

FIG. 2B is a graph illustrating dipole concentration in the gate dielectrics of the transistors 104 and 106 after the processing step shown in FIG. 1E in accordance with principles of the present disclosure. The curve 206 illustrates the dipole concentration in the transistor 104. The curve 208 illustrates the dipole concentration in the transistor 106. With reference to FIG. 1E, the position A corresponds to the interface between the interfacial dielectric layer 110a or 110b and the nanosheet 108a or 108b. The position B corresponds to the outer edge of the high-K dielectric layer 108a or 108b. In practice, the dashed line in FIG. 2B represents the position of the dipole layer 120.

The curve 206 illustrates that there is a sharp peak in concentration at the interface between the interfacial dielectric layer 110a and the high-K dielectric layer 118a of the transistor 104. The concentration drops off sharply on either side of the boundary. The curve 206 therefore illustrates desirable dipole concentration characteristics for the transistor 104 with a sharp peak at the interface between the high-K dielectric layer on the interfacial dielectric layer and sharply decreasing concentrations in the interfacial dielectric layer 108a and the high-K dielectric layer 118a going away from the interface. The sharp peak in concentration corresponds to the location of the dipole layer 120.

The curve 208 illustrates that the concentration of dipoles and the transistor 106 is substantially 0 for the entirety of both the interfacial dielectric layer 108b and the high-K dielectric layer 118b. This is beneficial because the transistor 106 is designed to not have dipole formation within the gate dielectric layers. Accordingly, the curves 206 and 208 illustrates the beneficial dipole concentration characteristics resulting from principles of the present disclosure.

Figure 3:
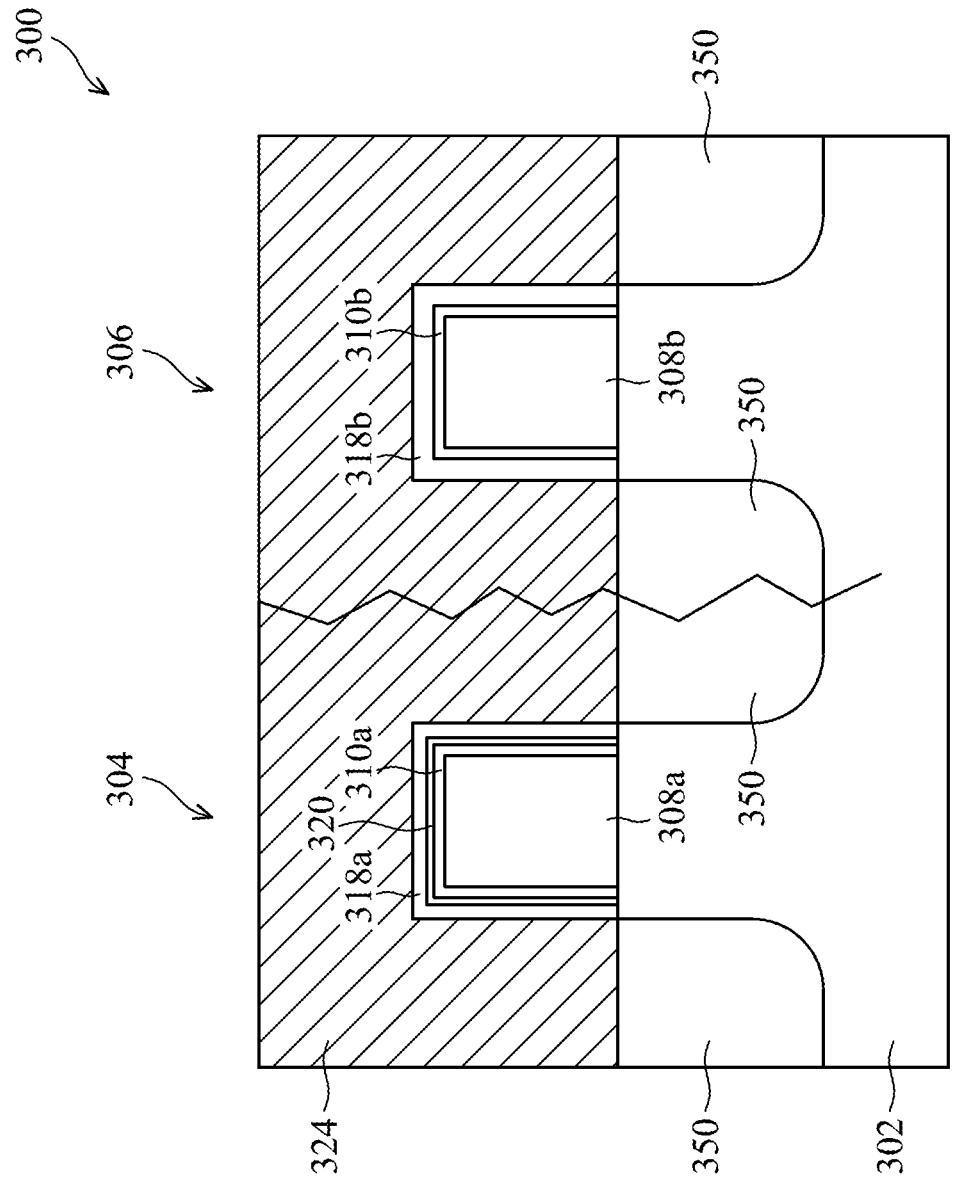
FIG. 3 is a cross-sectional view of an integrated circuit including FinFET transistors, according to one embodiment.

FIG. 3 is a cross-sectional view of an integrated circuit 300, according to one embodiment. The integrated circuit 300 has a first FinFET transistor 304 and a second FinFET transistor 306. The principles of dipole formation in the gate dielectric of the transistor 104 and prevention of dipole formation in the gate dielectric layers of the transistor 106 are utilized in forming the FinFET transistor 304 and the FinFET transistor 306. In particular, a dipole layer is formed in the gate dielectric of the transistor 304, but not in the transistor 306.

The FinFET transistor 304 includes a semiconductor fin 308a. The semiconductor fin 308a is the channel region of the transistor 304. The semiconductor fin 308a is formed above the semiconductor substrate 302. Shallow trench isolation regions 350 are formed in the substrate 302. The FinFET transistor 304 includes an interfacial dielectric layer 310a formed on the top and side surfaces of the semiconductor fin 308a. The FinFET transistor 304 includes a high-K dielectric layer 318a on the interfacial dielectric layer 310a. The FinFET transistor 304 includes a dipole layer 320 formed at the interface between the interfacial dielectric layer 310a and the high-K dielectric layer 318a. The interfacial dielectric layer 310a, the dipole layer 320, and the high-K dielectric layer 318a correspond to the gate dielectric of the FinFET transistor 304.

The FinFET transistor 306 includes a semiconductor fin 308b. The semiconductor fin 308b is the channel region of the transistor 306. The semiconductor fin 308b is formed above the semiconductor substrate 302. Shallow trench isolation regions 350 are formed in the substrate 302. The FinFET transistor 306 includes an interfacial dielectric layer 310b formed on the top and side surfaces of the semiconductor fin 308b. The FinFET transistor 306 includes a high-K dielectric layer 318b on the interfacial dielectric layer 310b. There is no dipole layer between the interfacial dielectric layer 310b and the high-K dielectric layer 318b of the transistor 306. The interfacial dielectric layer 310b and the high-K dielectric layer 318b correspond to the gate dielectric of the FinFET transistor 306.

The gate dielectrics of the FinFET transistors 304 and 306 are formed in the same manner as the gate dielectrics of the gate all around transistors 104 and 106 described in relation to FIGS. 1A-1G. In particular, the interfacial dielectric layers 310a and 310b are formed on the semiconductor fins 308a and 308b in a similar manner that the interfacial dielectric layers 110a and 110b are formed on the semiconductor nanosheets 108a and 108b as described in relation to FIGS. 1A-1G.

A dipole-inducing layer is then formed on the interfacial dielectric layers 310a and 310b in a similar manner as described for the dipole-inducing layer 112a and 112b described in relation to FIG. 1B. A hard mask layer is then formed on the dipole-inducing layer for the transistors 304 and 306 in the same manner as described for forming the hard mask 114a and 114b in relation to FIG. 1B.

A mask is then formed covering the transistor 304 by exposing the transistor 306, and a similar manner as described for forming the mask 116 of FIG. 1C. The hard mask layer, the dipole-inducing layer, and the interfacial dielectric layer 310b are then removed in a similar manner as described for the transistor 106 in relation to FIG. 1C. The interfacial dielectric layer 310b is then regrown on the semiconductor fin 308b in a similar manner as described for regrowing the interfacial dielectric layer 110b on the semiconductor nanosheets 108b in FIG. 1D.

Figure 4:
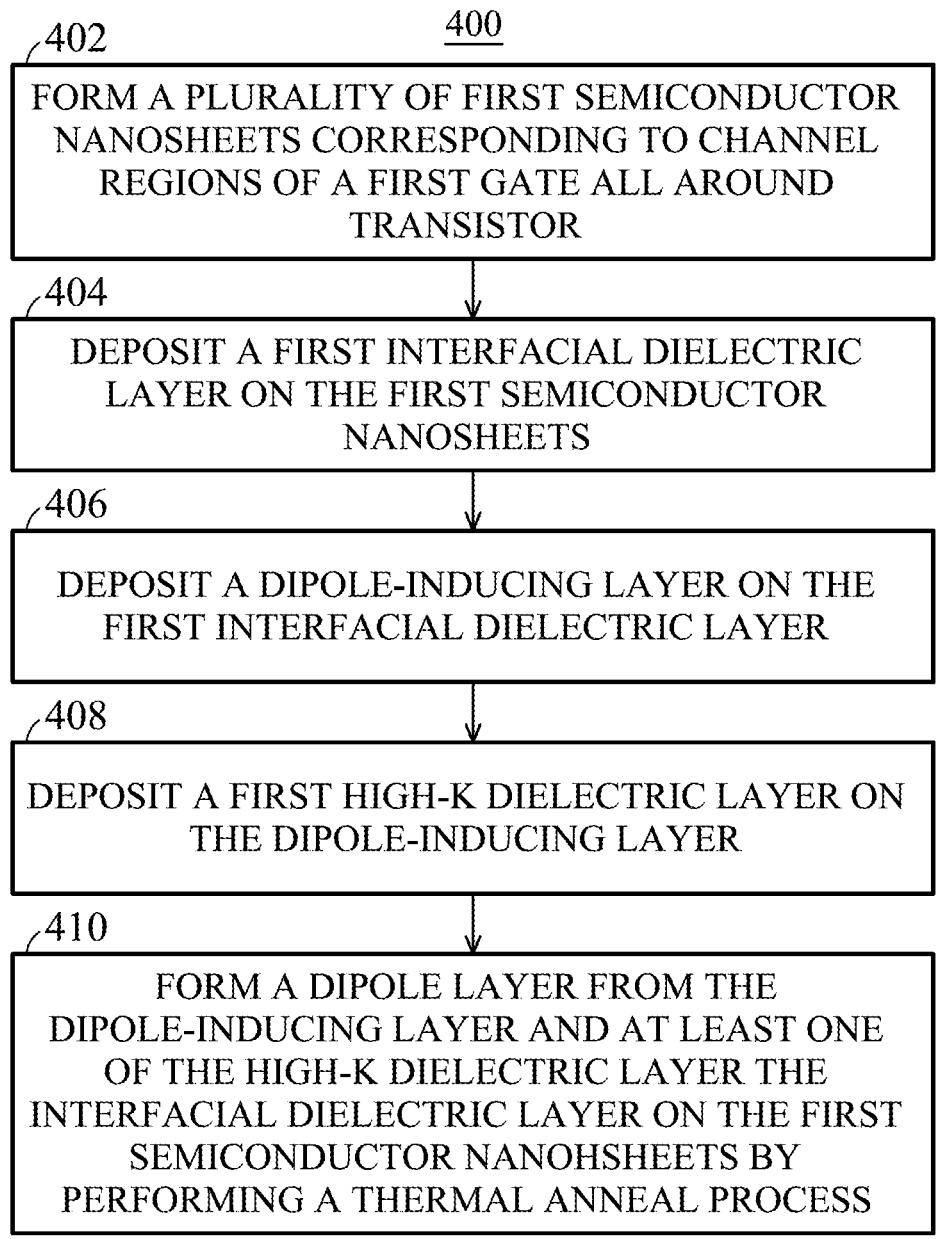
FIG. 4 is a flow diagram of a method for forming an integrated circuit, according to one embodiment.

The mask is then removed from the transistor 304 and an annealing process is performed to help generate a dipole layer 320 from the dipole-inducing layer in a similar manner as described for the transistor 104 in FIG. 1D. The high-K dielectric layers 318a and 318b are then deposited in a similar manner as described in relation to FIG. 1E for the high-K dielectric layers 118a and 118b. The gate metal 324 is then deposited for both the transistor 304 and the transistor 306 in a similar manner as described in FIG. 1F for forming the gate metal 124. The result of this process is the structure shown in FIG. 3. Other process steps and variations in the described process steps can be utilized performing FinFET transistors 304 and 306 without departing from the scope of the present disclosure. FIG. 4 is a flow diagram of a method 400 for forming an integrated circuit, according to one embodiment. The method 400 can utilize structures, processes, and components disclosed in relation to FIGS. 1A-3. At 402, the method 400 includes forming a plurality of first semiconductor nanosheets corresponding to channel regions of a first gate all around transistor. One example of a first gate all around transistor is the gate all around transistor 104 of FIGS. 1A-1G. One example of first semiconductor nanosheets are the semiconductor nanosheets 108 of the gate all around transistor 104 of FIGS. 1A-1G. At 404, the method 400 includes depositing a first interfacial dielectric layer on the first semiconductor nanosheets. One example of a first interfacial dielectric layer is the first interfacial dielectric layer 110 of the transistor 104 of FIG. 1A. At 406, the method 400 includes depositing a dipole-inducing layer on the first interfacial dielectric layer. One example of a dipole-inducing layer is the dipole-inducing layer 112 of FIG. 1B. At 408, the method 400 includes depositing a first high-K dielectric layer on the dipole-inducing layer. One example of a first high-K dielectric layer is the high-K dielectric layer 118 of the transistor 104 of FIG. 1E. At 410 the method 400 includes forming a dipole layer from the dipole-inducing layer and at least one of the high-K dielectric layer and the interfacial dielectric layer on the first semiconductor nanosheets by performing a thermal anneal process. One example of a dipole layer is the dipole layer 120 of FIG. 1E.

Figure 5:
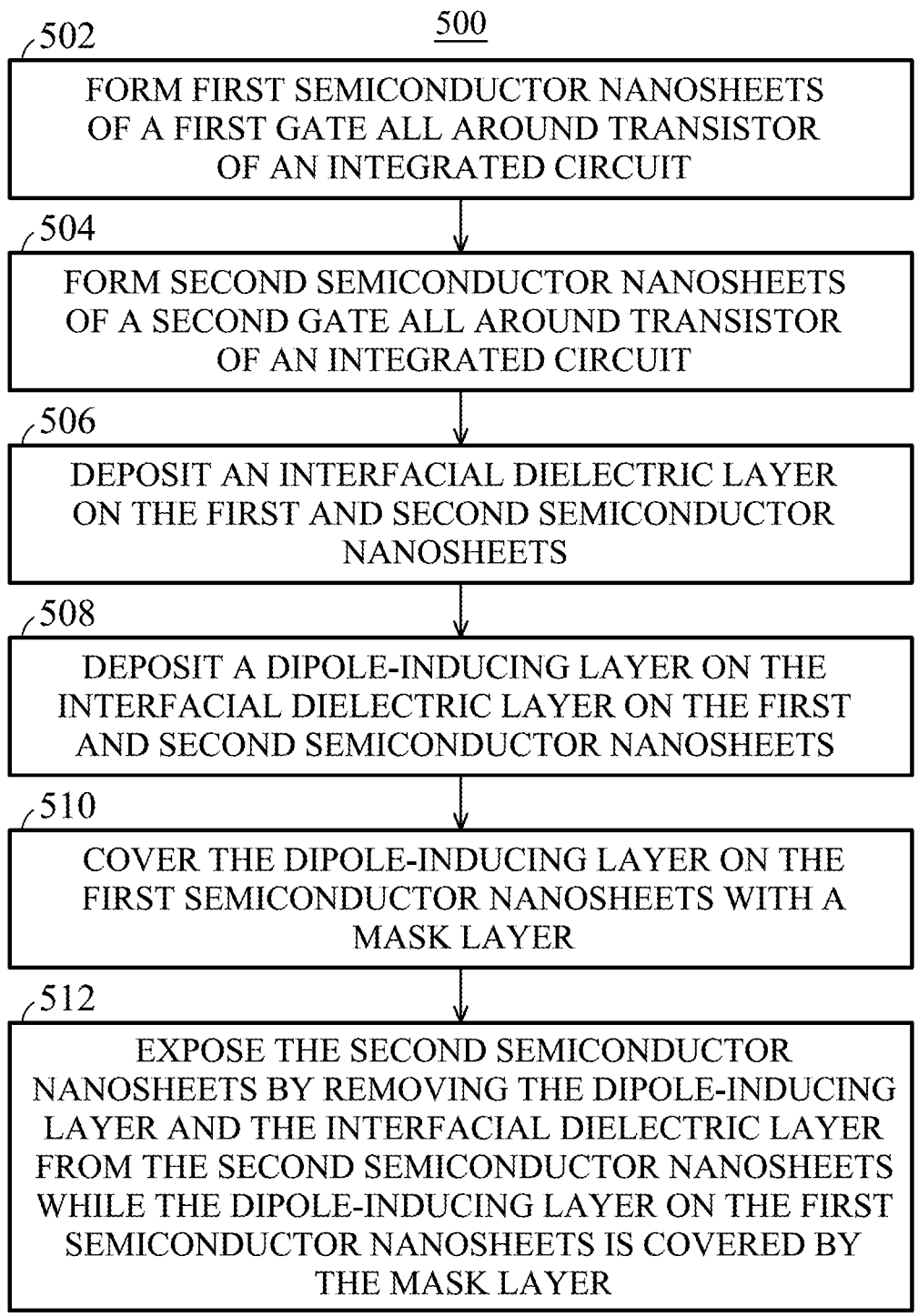
FIG. 5 is a flow diagram of a method for forming an integrated circuit, according to one embodiment.

FIG. 5 is a flow diagram of a method 500 for forming an integrated circuit, according to one embodiment. The method 500 can utilize structures, processes, and components disclosed in relation to FIGS. 1A-2. At 502, the method 500 includes forming first semiconductor nanosheets of a first gate all around transistor of an integrated circuit. One example of a first gate all around transistor is the transistor 104 of FIGS. 1A-1G. One example of first semiconductor nanosheets are the semiconductor nanosheets 108 of the transistor 104 of FIG. 1A. At 504, the method 500 includes forming second semiconductor nanosheets of a second gate all around transistor of the integrated circuit. One example of a second gate all around transistor is the transistor 106 of FIGS. 1A-1F. One example of second semiconductor nanosheets are the semiconductor nanosheets 108 of the transistor 106 of FIG. 1A. At 506, the method 500 includes depositing an interfacial dielectric layer on the first and second semiconductor nanosheets. One example of interfacial dielectric layer is the interfacial dielectric layer 110 of FIG. 1A. At 508, the method 500 includes depositing a dipole-inducing layer on the interfacial dielectric layer on the first and second semiconductor nanosheets. One example of a dipole-inducing layer is the dipole-inducing layer 112 of FIG. 1B. At 510, the method 500 includes covering the dipole-inducing layer on the first semiconductor nanosheets with a mask layer. One example of a mask layer is the hard mask layer 114 of FIG. 1B. At 512, the method 500 includes exposing the second semiconductor nanosheets by removing the dipole-inducing layer and the interfacial dielectric layer from the second semiconductor nanosheets while the dipole-inducing layer on the first semiconductor nanosheets is covered by the mask layer.

In one embodiment, a method for forming an integrated circuit includes forming a plurality of first semiconductor nanosheets corresponding to channel regions of a first gate all around transistor, depositing a first interfacial dielectric layer on the first semiconductor nanosheets and depositing a dipole-inducing layer on the first interfacial dielectric layer. The method includes depositing a first high-K dielectric layer on the dipole-inducing layer and forming a dipole layer from the dipole-inducing layer and at least one of the high-K dielectric layer and the interfacial dielectric layer on the first semiconductor nanosheets by performing a thermal anneal process.

In one embodiment, a method includes forming first semiconductor nanosheets of a first gate all around transistor of an integrated circuit, forming second semiconductor nanosheets of a second gate all around transistor of the integrated circuit, and depositing an interfacial dielectric layer on the first and second semiconductor nanosheets. The method includes depositing a dipole-inducing layer on the interfacial dielectric layer on the first and second semiconductor nanosheets, covering the dipole-inducing layer on the first semiconductor nanosheets with a mask layer, and exposing the second semiconductor nanosheets by removing the dipole-inducing layer and the interfacial dielectric layer from the second semiconductor nanosheets while the dipole-inducing layer on the first semiconductor nanosheets is covered by the mask layer.

In one embodiment, an integrated circuit includes a first gate all around transistor including a plurality of first semiconductor nanosheets corresponding to channel regions of the first gate all around transistor, a first interfacial dielectric layer positioned on the first semiconductor nanosheets, a dipole layer positioned on the first interfacial dielectric layer and including dipole material and a first high-K dielectric layer positioned on the dipole layer. The integrated circuit includes a second gate all around transistor including a plurality of second semiconductor nanosheets corresponding to channel regions of the second gate all around transistor, a second interfacial dielectric layer positioned on the second semiconductor nanosheets, and a second high-K dielectric layer positioned directly on the second interfacial dielectric layer. A concentration of the dipole material is zero in the second interfacial dielectric layer and the second high-K dielectric layer.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A method, comprising:
   forming a plurality of first semiconductor nanosheets corresponding to channel regions of a first gate all around transistor;

depositing a first interfacial dielectric layer on the first semiconductor nanosheets;

depositing a dipole-inducing layer on the first interfacial dielectric layer;

depositing a first high-K dielectric layer on the dipole-inducing layer after depositing the dipole-inducing layer such that the dipole inducing layer is positioned between the first interfacial dielectric layer and the first high-K dielectric layer; and forming a dipole layer from the dipole-inducing layer and at least one of high-K dielectric layer and the interfacial dielectric layer on the first semiconductor nanosheets by performing a thermal anneal process.

2. The method of claim 1, wherein forming the dipole layer comprises driving dipole dopants into at least one of the interfacial dielectric layer and the first high-K dielectric layer.

3. The method of claim 1, further comprising:

forming a plurality of second semiconductor nanosheets corresponding to channel regions of a second gate all around transistor;

depositing a second interfacial dielectric layer on the second semiconductor nanosheets; and depositing a second high-K dielectric layer on the second interfacial dielectric layer.

4. The method of claim 3, further comprising depositing the first high-K dielectric layer and the second high-K dielectric layer in a same deposition process.

5. The method of claim 4, wherein depositing the second interfacial dielectric layer on the second semiconductor nanosheets includes depositing the second interfacial dielectric layer after depositing the dipole-inducing layer on the first interfacial dielectric layer.

6. A method, comprising:

forming first semiconductor nanosheets of a first gate all around transistor of an integrated circuit;

forming second semiconductor nanosheets of a second gate all around transistor of the integrated circuit;

depositing an interfacial dielectric layer on the first and second semiconductor nanosheets;

depositing a dipole-inducing layer on the interfacial dielectric layer on the first and second semiconductor nanosheets;

covering the dipole-inducing layer on the first semiconductor nanosheets with a mask layer; and exposing the second semiconductor nanosheets by removing the dipole-inducing layer and the interfacial dielectric layer from the second semiconductor nanosheets while the dipole-inducing layer on the first semiconductor nanosheets is covered by the mask layer.

7. The method of claim 6, further comprising:

removing the mask layer from the dipole-inducing layer on the first semiconductor nanosheets; and forming a second interfacial dielectric layer on the second semiconductor nanosheets.

8. The method of claim 7, further comprising depositing a high-K dielectric on the dipole-inducing layer on the first semiconductor nanosheets and on the interfacial dielectric layer on the second semiconductor nanosheets.

9. The method of claim 8, further comprising forming a dipole layer from the dipole-inducing layer by performing a thermal annealing process after deposition of the high-K dielectric.

10. The method of claim 8, further comprising forming a dipole layer by polarizing at least one of the dipole-inducing layer, the interfacial dielectric layer on the first semiconductor nanosheets, and the high-K dielectric layer.

11. The method of claim 8, further comprising depositing a gate metal on the high-K dielectric.

12. The method of claim 6, further comprising removing the mask layer and forming the second interfacial dielectric layer in a same process step.

13. The method of claim 12, wherein removing the mask layer includes etching the mask layer with an oxygen-containing etchant.

14. The method of claim 12, wherein removing the mask layer includes etching the mask layer with an ammonium hydroxide-containing etchant.

15. The method of claim 6, further comprising: coating a photoresist over the first semiconductor nanosheets, wherein a spacing between two adjacent nanosheets is free of photoresist.

16. The method of claim 6, wherein exposing the second semiconductor nanosheets includes partially removing an insulating feature under the second semiconductor nanosheets.

17. An integrated circuit, comprising:

a first gate all around transistor including:

a plurality of first semiconductor nanosheets corresponding to channel regions of the first gate all around transistor;

a first interfacial dielectric layer positioned on the first semiconductor nanosheets;

a dipole layer positioned on the first interfacial dielectric layer and including dipole material; and a first high-K dielectric layer positioned on the dipole layer; and a second gate all around transistor including:

a plurality of second semiconductor nanosheets corresponding to channel regions of the second gate all around transistor;

a second interfacial dielectric layer positioned on the second semiconductor nanosheets; and a second high-K dielectric layer positioned directly on the second interfacial dielectric layer, wherein a concentration of the dipole material is zero in the second interfacial dielectric layer and the second high-K dielectric layer, wherein a distribution of dipole dopants in the first interfacial dielectric layer and a distribution of dipole dopants in the first high-K dielectric layer are arranged to mirror symmetrically along a central line between the first interfacial dielectric layer and the first high-K dielectric layer.

18. The integrated circuit of claim 17, wherein the dipole layer includes at least one of La, Y, Al, Sr, Er, Sc, and Nb.

19. The integrated circuit of claim 17, wherein the dipole layer is less than 15 angstroms thick.

20. The integrated circuit of claim 17, further comprising a gate metal on the first high-K dielectric layer.

* * * * *